United States Patent [19]
Numasawa et al.

[11] Patent Number: 6,048,795
[45] Date of Patent: Apr. 11, 2000

[54] PROCESS OF FABRICATING A SEMICONDUCTOR DEVICE HAVING NITROGEN-CONTAINING SILICON LAYER AND REFRACTORY METAL LAYER

[75] Inventors: Youichiro Numasawa; Shinji Fujieda; Yoshinao Miura, all of Tokyo, Japan

[73] Assignee: NEC Corporation, Tokyo, Japan

[21] Appl. No.: 08/840,550

[22] Filed: Apr. 3, 1997

Related U.S. Application Data

[63] Continuation of application No. 08/548,834, Oct. 26, 1995, abandoned.

[30] Foreign Application Priority Data

Nov. 4, 1994 [JP] Japan .................................. 6-293650

[51] Int. Cl.⁷ .................................................. H01C 21/44
[52] U.S. Cl. .................... 438/685; 438/687; 438/785; 438/791; 438/766; 438/626; 438/627; 438/632; 438/635
[58] Field of Search ................................. 257/412, 413, 257/763, 764; 438/396, 391, 298, 290, 791; 458/626, 627, 632, 635, 685, 687, 785

[56] References Cited

U.S. PATENT DOCUMENTS

| | | | |
|---|---|---|---|
| 4,080,718 | 3/1978 | Richman | .................................. 29/571 |
| 5,521,527 | 5/1996 | Sakata et al. | .............................. 361/21 |
| 5,610,099 | 3/1997 | Stevens et al. | ........................... 438/626 |
| 5,672,523 | 9/1997 | Yamamoto et al. | ..................... 438/396 |
| 5,804,846 | 9/1998 | Fuller | ....................................... 257/252 |

FOREIGN PATENT DOCUMENTS 62-92470  4/1987  Japan ...................................... 257/412

OTHER PUBLICATIONS

"Novel Nice structure for high reliability and high Performance 0.25 ym dual gate CNOV."; Kevoi et al IEDM 1993. PP13.2.1–13.2.4.

Extended Abstracts No. 2 (The 41st Spring Meeting, 1994); The Japan Society of Applied Physics and Related Societies, Mar. 28–31, 1994.

*Primary Examiner*—David Nelms
*Assistant Examiner*—Reneé R. Berry
*Attorney, Agent, or Firm*—Sughrue, Mion, Zinn, Macpeak & Seas, PLLC

[57] ABSTRACT

A field effect transistor available for 1 giga-bit dynamic random access memory device has a two-layer gate structure consisting of a lower layer of nitrogen-containing silicon and an upper layer of refractory metal, and the nitrogen-containing silicon effectively prevents the gate oxide layer from alkaline metals diffused from the refractory metal.

25 Claims, 5 Drawing Sheets

PROCESS OF FABRICATING A SEMICONDUCTOR DEVICE HAVING NITROGEN-CONTAINING SILICON LAYER AND REFRACTORY METAL LAYER

This is a Continuation of application Ser. No. 08/548,834 filed Oct. 26, 1995 now abandoned.

FIELD OF THE INVENTION

This invention relates to a field effect transistor and, more particularly, to the structure of a field effect transistor with a two-layer gate structure formed from a nitrogen containing silicon layer and refractory metal layer.

DESCRIPTION OF THE RELATED ART

A field effect transistor is widely used in a semiconductor ultra large scale integration such as a semiconductor dynamic random access memory device and a gate array, and is one of the most important electric parts. A gate electrode is a structural element of the field effect transistor, and affects the transistor characteristics. The gate electrode has been formed of polysilicon because of the self-align introduction of dopant impurity into source and drain regions. The polysilicon is too resistive to rapidly propagate a signal for a field effect transistor designed under 0.5 micron rules, and a two-layer gate structure is used for the miniature field effect transistor. A polysilicon layer and a refractory metal silicide layer form the two-layer gate structure.

The field effect transistor has been progressively miniaturized, and a 1 giga-bit dynamic random access memory device is considered to be fabricated from field effect transistors of 0.15 micron gate width. If the two-layer gate structure, i.e., the laminated structure of the polysilicon layer and the refractory metal silicide layer is employed in the ultra miniature field effect transistor forming a part of a memory cell of the 1 giga-bit dynamic random access memory device, the word line becomes too resistive, and deteriorates the access speed.

In the circumstances, refractory metals such as tungsten and molybdenum are attractive. However, the refractory metals are hardly available for a single layer gate electrode, because the refractory metals contain alkaline metals which diffuse into the gate insulating layer. The alkaline metals diffused into the gate insulating layer cause the transistor characteristics to fluctuate, and deteriorates the reliability of the field effect transistor. Moreover, the single layer refractory metal gate electrode does not allow a manufacturer to regulate the threshold of the field effect transistor through the channel doping as being popular in the polysilicon gate electrode.

In order to solve the problems inherent in the single layer refractory metal gate electrode, a three-layer gate structure is proposed as shown in FIG. 1 of the drawings. The prior art field effect transistor is fabricated on a silicon substrate 1, and a thick field oxide layer 2 defines an active area assigned to the prior art field effect transistor. Though not shown in FIG. 1, source and drain regions are formed in the active area, and a channel region 3a spaces the source region and the drain region from each other. The channel region 3a is covered with a gate oxide layer 3b, and a three-layer gate structure 3c extends on the gate oxide layer 3b.

The three-layer gate structure 3c consists of a doped polysilicon layer 3d, a barrier metal layer 3e on the doped polysilicon layer 3d and a refractory metal layer 3f on the barrier metal layer 3e. The proceedings of the 41st Spring Meeting of the Japan Society of Applied Physics and Related Societies disclose the three-layer gate structure using a tungsten nitride layer and a tungsten layer as the barrier metal layer 3e and the refractory metal layer 3f.

The barrier metal layer 3e prevents the gate oxide layer 3b from alkaline metals diffused from the refractory metal layer 3f, and a channel doping is carried out through the doped polysilicon layer 3d. Thus, the three-layer gate structure solves the problems inherent in the single layer refractory metal gate electrode.

However, the prior art field effect transistor encounters a problem in production cost. The doped polysilicon layer 3d, the barrier metal layer 3e and the refractory metal layer 3f are laminated by using different deposition systems. In other words, the three-layer gate structure is fabricated through a complex process sequence, and the complex process sequence increases the production cost.

Another problem is a well-reproducible patterning on the three-layer gate structure. As described hereinbefore, the three-layer gate structure is expected to be employed in the 1 giga-bit dynamic random access memory device, and doped polysilicon, tungsten nitride and tungsten layers are patterned into the three-layer gate structure of 0.15 micron gate width. However, those layers different in material from one another are hardly patterned into the three-layer gate structure in good reproducibility. An irregular gate pattern deteriorates the production yield. The three layers may be patterned into the three-layer gate structure under strict process control. However, such a strict process control consumes time and labor, and increases the production cost.

SUMMARY OF THE INVENTION

It is therefore an important object of the present invention to provide a field effect transistor a gate structure of which is well reproducible without increase of the production cost.

To accomplish the object, the present invention proposes to use a two-layer gate structure consisting of a nitrogen containing silicon layer and a refractory metal layer.

In accordance with the present invention, there is provided a field effect transistor fabricated on a semiconductor substrate, comprising: source and drain regions formed in the semiconductor substrate, and spaced from each other; a channel region formed in the semiconductor substrate between the source and drain regions, and regulated in dopant concentration; a gate insulating layer covering at least the channel region; and a two-layer gate structure formed on the gate insulating layer, and including a lower layer of nitrogen-containing silicon and an upper layer of a refractory metal.

The ammonia may be regulated in such a manner that the nitrogen-containing silicon layer doped with the dopant impurity has the resistivity equal to or less than $10^{12}$ ohm-cm.

The nitrogen-containing silicon layer may be equal to or greater than 20 nanometers thick under the resistivity of $10^{10}$ ohm-cm so as to prevent the gate insulating layer from sodium.

The refractory metal may be selected from the group consisting of tungsten, molybdenum, titan and tantalum.

The nitrogen-containing silicon layer may be one of the single crystal, the polysilicon and the amorphous.

The nitrogen-containing silicon layer allows a channel doping as similar to a polysilicon. When the nitrogen content in the silicon layer is optimized, the nitrogen provides an appropriate barrier against alkaline metals contained in the refractory metal. In other words, the nitrogen-containing silicon layer compromises between the requirements achieved by the polysilicon and the barrier metal layer of the three layer structure.

BRIEF DESCRIPTION OF THE DRAWINGS

The features and advantages of the field effect transistor according to the present invention will be more clearly understood from the following description taken in conjunction with the accompanying drawings in which.

DESCRIPTION OF THE PREFERRED EMBODIMENTS

First Embodiment

Referring first to FIGS. 2A to 2E of the drawings, a process of fabricating an n-channel type field effect transistor embodying the present invention starts with preparation of a p-type silicon substrate 10, and the resistivity of the p-type silicon substrate 10 ranges from 10 ohm-cm to 15 ohm-cm. A thick field oxide layer 11 is selectively grown to 300 to 500 nanometers thick on the major surface of the p-type silicon substrate 10, and the thick field oxide layer 11 defines an active area assigned to the field effect transistor. A local-oxidation of silicon technology is available for the thick field oxide layer 11.

Figure 2A:
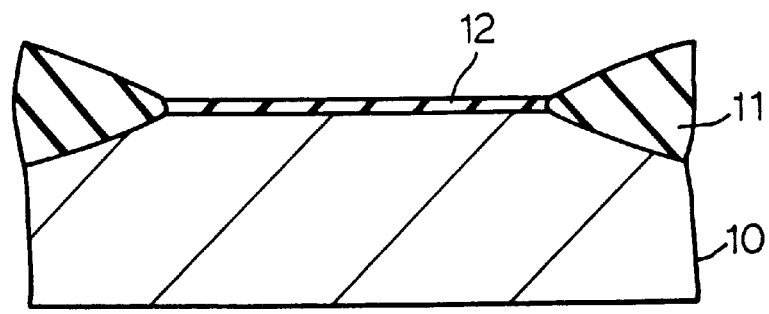
FIGS. 2A to 2E are cross sectional views showing a process sequence for fabricating an n-channel type field effect transistor according to the present invention.

Subsequently, the p-type silicon substrate 10 is placed in an oxidation atmosphere, and a gate oxide layer 12 is thermally grown to 8 to 120 nanometers thick on the active area. The resultant structure at this stage is illustrated in FIG. 2A.

Figure 2B:
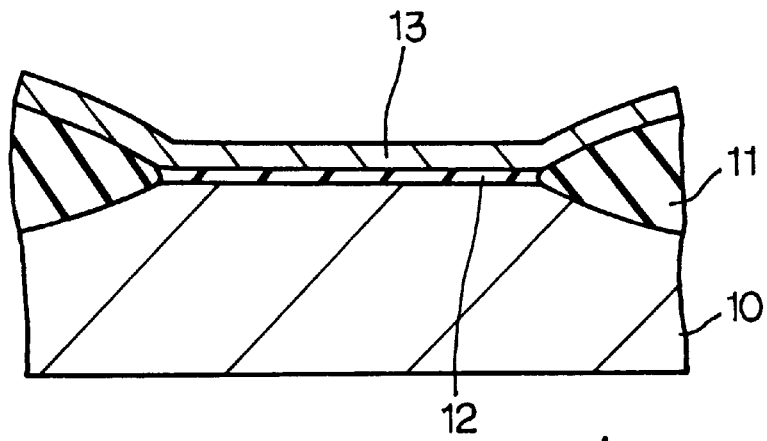

Subsequently, a nitrogen-containing silicon layer 13 is grown on the entire surface of the structure. In detail, the resultant structure shown in FIG. 2A is placed in a vertical low-pressure chemical vapor deposition system. Ammonia gas ($NH_3$) is added to gaseous mixture of silane ($SiH_4$) and a carrier gas, and nitrogen is used as the carrier gas in this instance. The gaseous mixture is introduced into a reactor of the vertical low-pressure vapor phase growing system, and the reaction chamber is maintained at 700 to 800 degrees centigrade. The amount of ammonia gas is regulated in such a manner that the nitrogen-containing silicon layer 13 is not greater than $10^{12}$ ohm-cm after a doping stage described hereinbelow. Then, the nitrogen-containing silicon layer 13 is deposited over the entire surface of the resultant structure as shown in FIG. 2B.

The required thickness of the nitrogen-containing silicon layer 13 is dependent on the amount of ammonia gas added to the gaseous mixture. If the resistivity of the nitrogen-containing silicon layer 13 is of the order of $10^{10}$ ohm-cm, the thickness not less than 20 nanometers is effective against sodium.

Figure 2C:
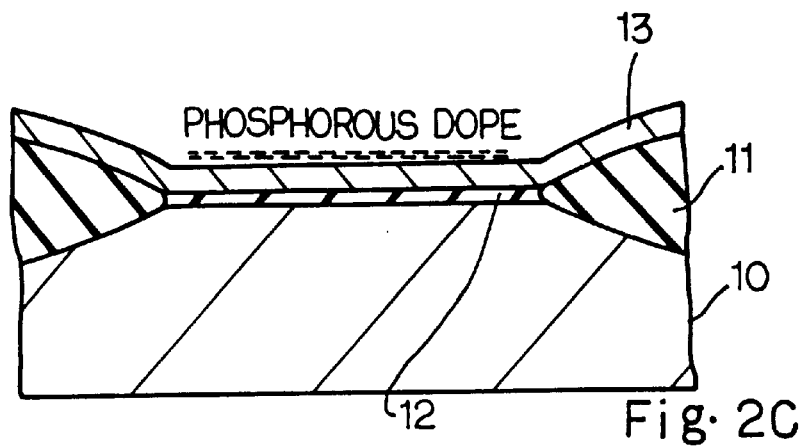

After the deposition of the nitrogen-containing silicon layer 13, phosphorous is doped into the nitrogen-containing silicon layer 13 by using a low temperature thermal diffusion technique as shown in FIG. 2C. An ion implantation is available for the phosphorous doping. If other n-channel type field effect transistors are concurrently fabricated on the p-type silicon substrate 10, phosphine ($PH_3$) may be mixed with the gaseous mixture so as to dope phosphorous into the nitrogen-containing silicon layer 13 during the deposition. The amount of phosphorous doped into the nitrogen-containing silicon layer 13 is regulated to an appropriate value depending upon the designed threshold of the n-channel type field effect transistor.

Figure 2D:
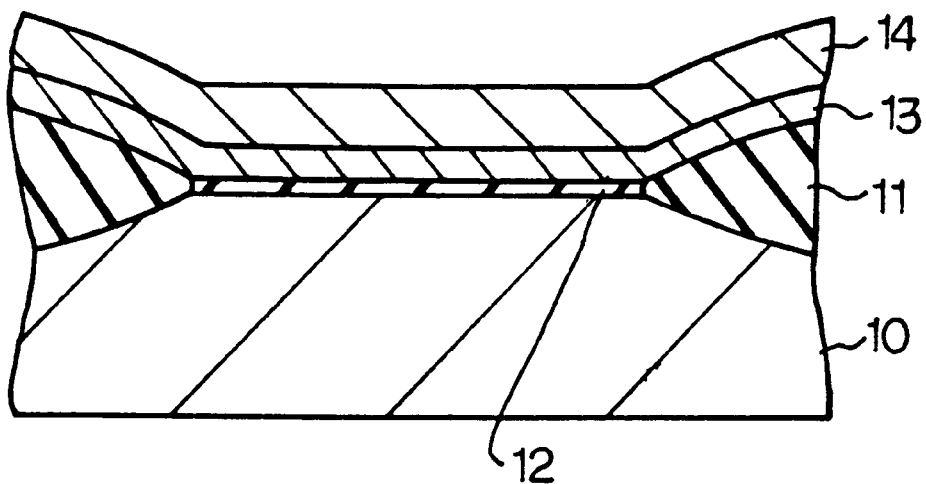

Subsequently, tungsten is sputtered to 200 nanometers thick onto the nitrogen-containing silicon layer 13, and the nitrogen-containing silicon layer 13 is overlain by the tungsten layer 14 as shown in FIG. 2D. If a chemical vapor deposition is used instead of the sputtering, source gas containing $WCl_6$ is introduced into a reactor, and the tungsten layer 14 is deposited through the hydrogen reduction. The resultant structure is illustrated in FIG. 2D.

An appropriate photo-resist mask is provided on the tungsten layer 14 through lithographic techniques, and the uncovered tungsten layer 14 and the nitrogen-containing silicon layer 13 therebeneath are removed by using a reactive ion etching. As a result, a two-layer gate structure is provided on the gate oxide layer 12, and consists of a nitrogen-containing silicon layer 13a and a tungsten layer 14a.

Silicon oxide is deposited to 50 nanometers thick over the entire surface of the structure by using a chemical vapor deposition technique, and the silicon oxide layer is etched back so as to form side walls 15a and 15b on both sides of the two-layer gate structure.

Figure 2E:
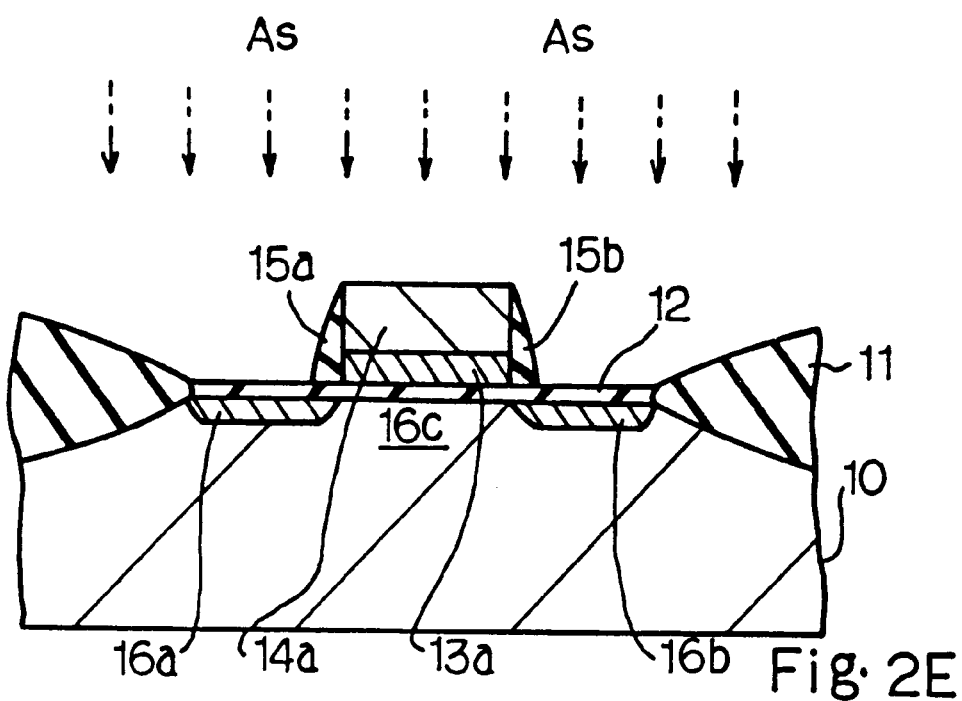

Finally, arsenic atom is ion implanted into the active area as shown in FIG. 2E, and is activated through an annealing. A source region 16a and a drain region 16b are formed in the active area on both sides of a channel region 16c under the two-layer gate structure. An LDD (Lightly-Doped-Drain) structure may be employed instead of the single drain structure.

The appropriately controlled nitrogen serves as a barrier against alkaline metals diffused from the tungsten layer 14a, and the prevents the silicon oxide layer 12 from the alkaline metals such as sodium. For this reason, the n-channel type field effect transistor is free from fluctuations of transistor characteristics due to the alkaline metals.

The nitrogen-containing silicon layer 13 allows the manufacturer to regulate the threshold through the phosphorous doping. Thus, the two-layer gate structure is free from the problems inherent in a single refractory metal gate electrode as similar to the prior art three-layer gate structure.

Moreover, the two-layer gate structure requires the vapor phase growing system for the nitrogen-containing silicon layer and the sputtering system for the tungsten layer, and is more economical than the three-layer gate structure. The etching precisely patterns the two-layer gate structure rather than the three-layer gate structure, and the production yield is enhanced. Thus, the two-layer gate structure according to the present invention is superior to the prior art three-layer gate structure.

Second Embodiment

Figure 3A:
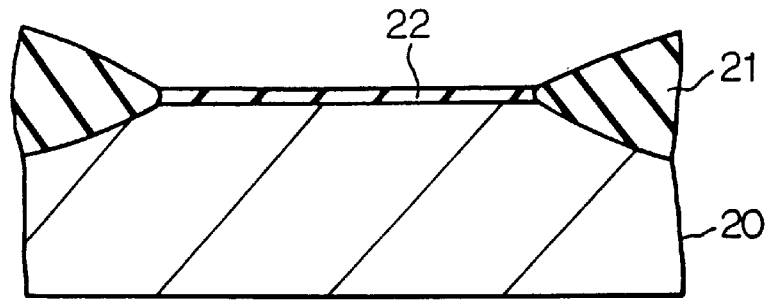
FIGS. 3A to 3E are cross sectional views showing another process sequence for fabricating an n-channel type field effect transistor according to the present invention.

FIGS. 3A to 3E of the drawings illustrate another process sequence for fabricating a p-channel type field effect transistor embodying the present invention. The process starts with an n-type silicon substrate 20, and the n-type silicon substrate 20 is regulated to 10 to 15 ohm-cm. A thick field oxide layer 21 is selectively grown on the major surface of the n-type silicon substrate 20 by using the local oxidation of silicon technology. The thick field oxide layer 21 defines an active area assigned to the p-channel type field effect transistor. The active area is thermally oxidized so as to be covered with a thin gate oxide layer 22. The resultant structure is illustrated in FIG. 3A.

Figure 3B:
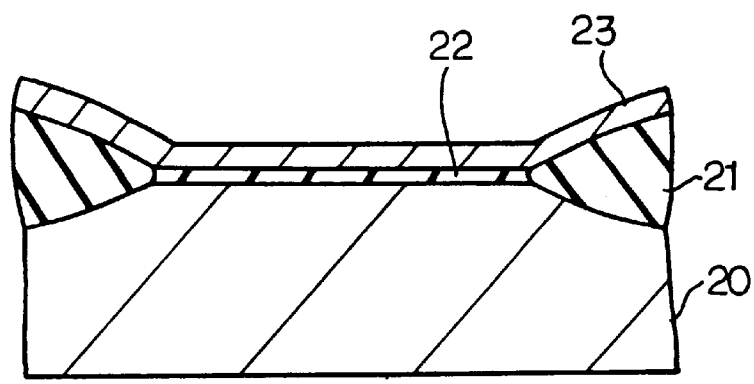
Figure 3C:
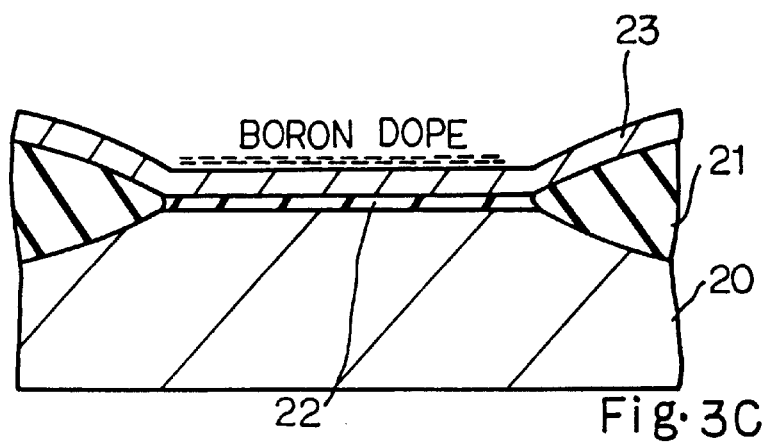

A nitrogen-containing silicon layer 23 is deposited over the entire surface of the structure by using a chemical vapor deposition as shown in FIG. 3B, and boron is doped into the nitrogen-containing silicon layer 23 through the low temperature thermal diffusion technique.

An ion implantation is available for the boron doping. The boron is doped into the nitrogen-containing silicon layer 23 by mixing diboran ($B_2H_6$) into the gaseous mixture.

Figure 3D:
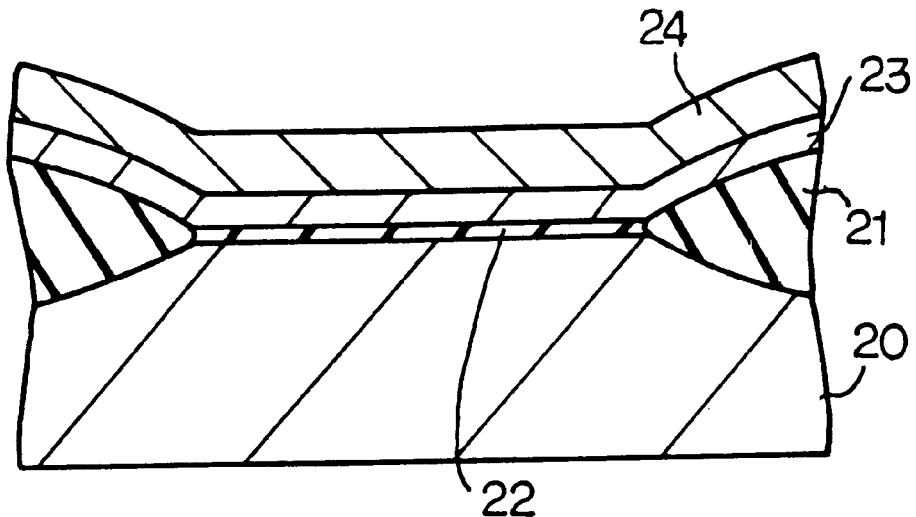
Figure 3E:
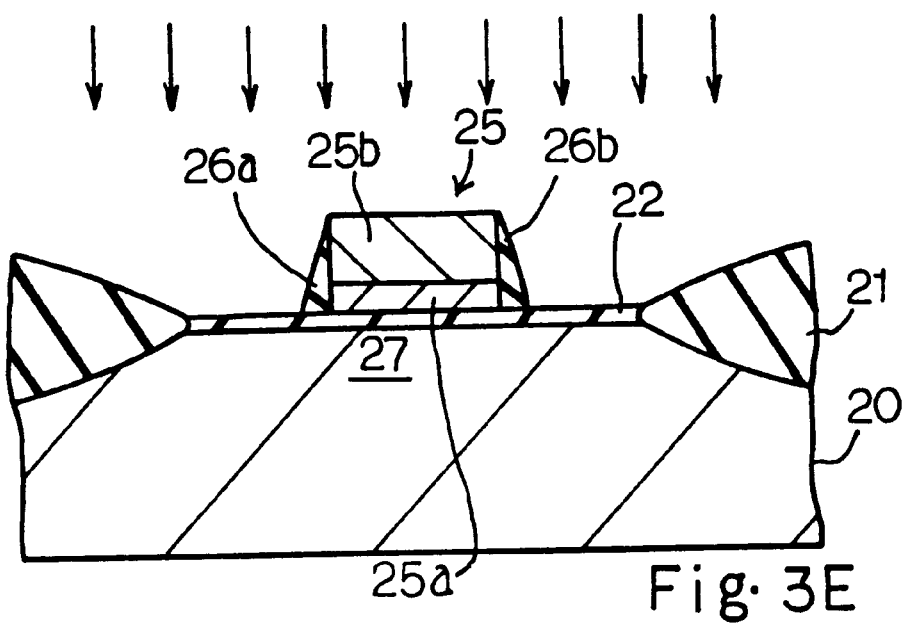

Molybdenum is deposited to 200 nanometers thick over the nitrogen-containing silicon layer 23 by using a chemical vapor deposition, and the nitrogen-containing silicon layer 23 is overlain by the molybdenum layer 24. The source gas and the carrier gas for the deposition are $Mo(CO)_6$ and Ar, and the molybdenum is produced from the $Mo(CO)_6$ gas through pyrolysis. Of course, a sputtering and other chemical vapor deposition processes are arbitrarily available for the molybdenum layer 24. The resultant structure is illustrated in FIG. 3D.

An appropriate mask is provided on the molybdenum layer 24 through the lithographic techniques, and the molybdenum layer 24 and the nitrogen-containing silicon layer 23 are successively etched away so as to pattern them into a two-layer gate structure 25. In this instance, a dry etching is applied to the molybdenum layer 24 and the nitrogen-containing silicon layer 23. The two-layer gate structure 25 consists of a nitrogen-containing silicon layer 25a and a molybdenum layer 25b.

Side walls 26a and 26b are formed on both sides of the two-layer gate structure as similar to the first embodiment. Using the two-layer gate structure 25 and the side walls 26a/26b as a mask, boron is ion implanted into the active area. The ion-implanted boron is activated through a heat treatment, and forms source and drain regions (not shown) on both sides of a channel region 27.

The p-channel type field effect transistor implementing the second embodiment achieves all the advantages of the first embodiment.

Figure 1:
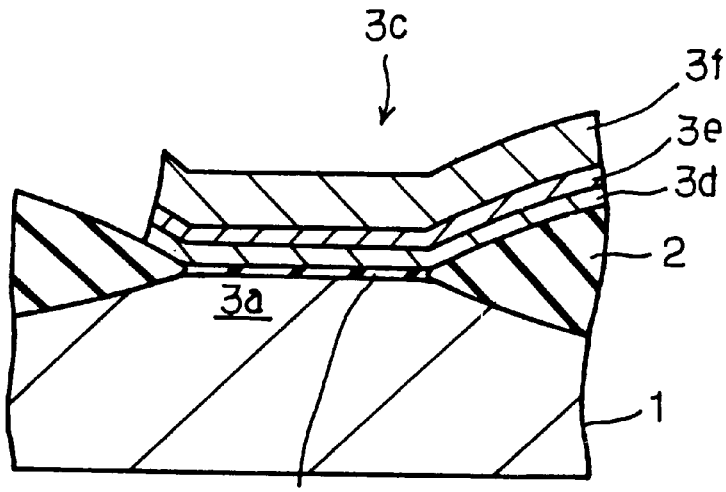
FIG. 1 is a cross sectional view showing the structure of the prior art field effect transistor with the three-layer gate structure.
Figure 4:
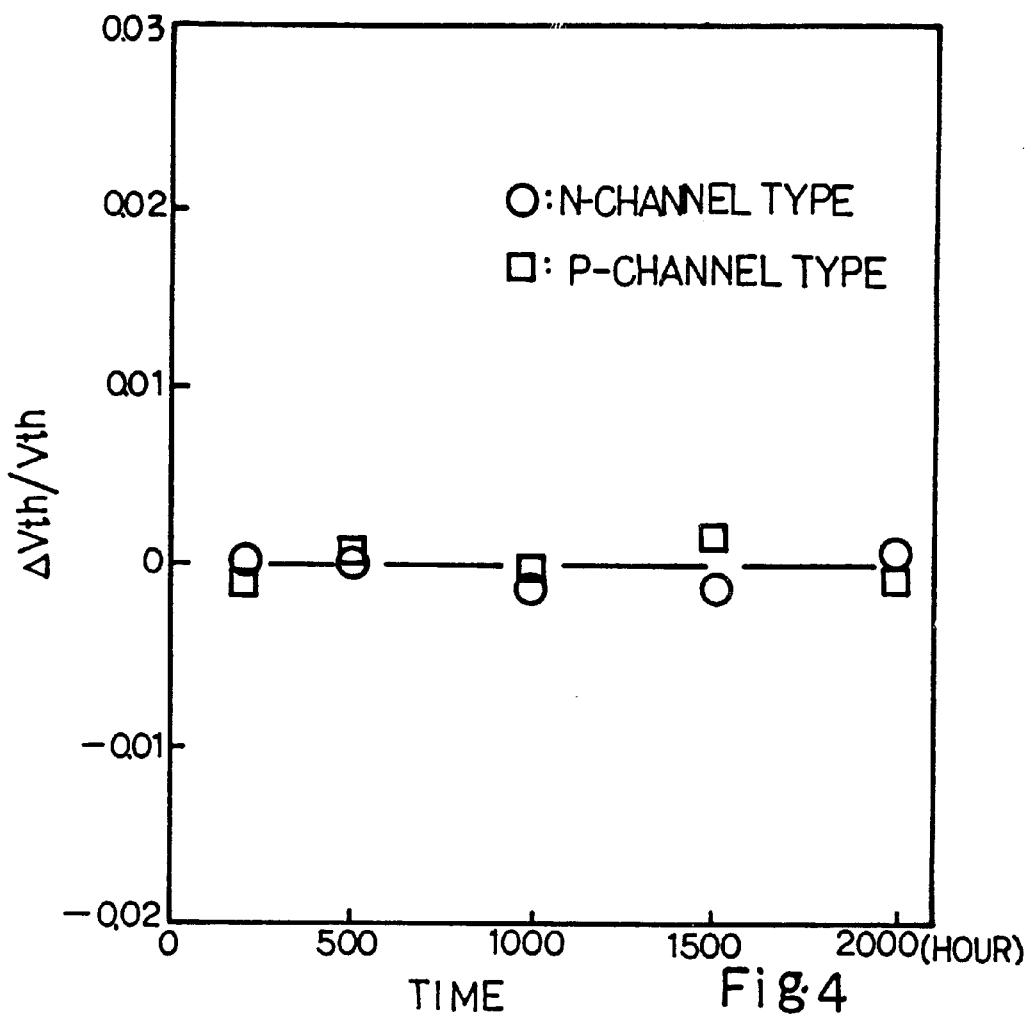
FIG. 4 is a graph showing variation of the threshold of the n-channel type field effect transistor.

The present inventors evaluated the nitrogen-containing silicon layers 13a and 25a. The n-channel type field effect transistors and the p-channel type field effect transistors were fabricated through the process sequences described hereinbefore. The p-channel type field effect transistors and the n-channel enhancement type field effect transistors were placed in high temperature atmosphere at 1000 degrees centigrade, and a bias voltage of 5 volts were applied between the two-layer gate structures and the p-type substrate 10/the n-type substrate 20. The threshold Vth of the n-channel type field effect transistor and the threshold Vth of the p-channel type field effect transistor were measured, and the ratio of a variation dvth to the threshold Vth was plotted in FIG. 4.

The present inventors further fabricated a field effect transistor with a two-layer gate structure consisting of a polysilicon layer and a refractory metal layer, and the polysilicon layer did not contain nitrogen. The comparative field effect transistors was also subjected to the bias under the high temperature atmosphere, and the ratio was calculated.

The comparative field effect transistors widely varied the threshold around 100 hours. However, the n-channel type field effect transistors and the p-channel type field effect transistors did not vary the thresholds over 2000 hours. Thus, the present inventors confirmed the effect of the nitrogen-containing silicon layers.

Although particular embodiments of the present invention have been shown and described, it will be obvious to those skilled in the art that various changes and modifications may be made without departing from the spirit and scope of the present invention.

For example, other refractory metal such as, for example, titanium or tantalum is available for the two-layer gate structure, and the two-layer gate structure may contain an alloy layer such as Mo-W. Moreover, single crystal silicon, polysilicon and amorphous silicon are available for the nitrogen-containing silicon layer.

The embodiments are bulk transistors. However, the present invention is applicable to a thin film transistor fabricated on an insulating substrate, by way of example.

What is claimed is:

1. A process of fabricating a semiconductor device, comprising the steps of:
    forming a gate insulating layer on a semiconductor layer;
    forming a nitrogen-containing silicon layer doped with a first dopant impurity on said gate insulating layer;
    forming a refractory metal layer on said nitrogen-containing silicon layer;
    patterning said refractory metal layer and said nitrogen-containing silicon layer into a gate electrode; and
    introducing a second dopant impurity into said semiconductor layer in a self-aligned manner with said gate electrode so as to form a source region and a drain region in said semiconductor layer.

2. The process as set forth in claim 1, wherein said forming of said nitrogen-containing silicon layer includes the steps of:
    forming an intentionally updoped nitrogen-containing silicon layer on said gate insulating layer, and
    introducing said first dopant impurity into said intentionally undoped nitrogen-containing silicon layer.

3. The process as set forth in claim 2, in which said first dopant impurity is introduced into said intentionally undoped nitrogen-containing silicon layer by using one of a thermal diffusing technique and an ion-implantation.

4. The process as set forth in claim 1, wherein said refractory metal is selected from the group consisting of tungsten, molybdenum, titanium and tantalum.

5. The process as set forth in claim 1 in which said first said intentionally undoped nitrogen-containing silicon layer is formed by means of chemical vapor deposition using a mixture of Ammonia gas, Silane and a carrier gas, a concentration of said Ammonia gas being regulated so that said nitrogen-containing layer has a resistivity of not greater than $10^{12}$ ohm-cm.

6. The process as set forth in claim 1, said nitrogen-containing silicon layer being formed so that said nitrogen-containing silicon layer has a resistivity of not greater than $10^{12}$ ohm-cm.

7. The process as set forth in claim 6, so that said nitrogen-containing silicon layer has a resistivity of approximately $10^{10}$ ohm-cm and a thickness of not less than 20 nanometers.

8. A process of fabricating a semiconductor device, comprising the steps of:
    forming a gate insulating layer on a p-type semiconductor layer;
    forming a phorphorous-doped nitrogen-containing silicon layer on said gate insulating layer;
    forming a refractory metal layer of material selected from the group consisting of tungsten, molybdenum, titanium and tantalum on said nitrogen-containing silicon layer;

patterning said refractory metal layer and said nitrogen-containing silicon layer into a gate electrode; and introducing arsenic into said p-type semiconductor layer in a self-aligned manner with said gate electrode so as to form a source region and a drain region in said p-type semiconductor layer.

9. The process as set forth in claim 8, wherein said forming of said phosphorous-doped nitrogen-containing silicon layer includes the steps of:

forming an intentionally updoped nitrogen-containing silicon layer on said gate insulating layer, and introducing phosphorous into said intentionally undoped nitrogen-containing silicon layer.

10. The process as set forth in claim 8 in which said intentionally undoped nitrogen-containing silicon layer is formed by means of chemical vapor deposition using a mixture of Ammonia gas, Silane and a carrier gas, a concentration of said Ammonia gas being regulated so that said nitrogen-containing layer has a resistivity of not greater than $10^{12}$ ohm-cm.

11. The process as set forth in claim 8, said nitrogen-containing silicon layer being formed so that said nitrogen-containing silicon layer has a resistivity of not greater than $10^{12}$ ohm-cm.

12. The process as set forth in claim 11, so that said nitrogen-containing silicon layer has a resistivity of approximately $10^{10}$ ohm-cm and a thickness of not less than 20 nanometers.

13. The process as set forth in claim 9, in which said phosphorous is introduced into said intentionally undoped nitrogen-containing silicon layer by using one of a thermal diffusing technique and an ion-implantation.

14. A process of fabricating a semiconductor device, comprising the steps of:

forming a gate insulating layer on an n-type semiconductor layer;

forming a boron-doped nitrogen-containing silicon layer doped on said gate insulating layer;

forming a refractory metal layer of material selected from the group consisting of tungsten, molybdenum, titanium and tantalum, on said nitrogen-containing silicon layer;

patterning said refractory metal layer and said nitrogen-containing silicon layer into a gate electrode; and introducing boron into said n-type semiconductor layer in a self-aligned manner with said gate electrode so as to form a source region and a drain region in said n-type semiconductor layer.

15. The process as set forth in claim 14, wherein said forming of said boron-doped nitrogen-containing silicon layer includes the steps of:

forming an intentionally updoped nitrogen-containing silicon layer on said gate insulating layer, and introducing boron into said intentionally undoped nitrogen-containing silicon layer.

16. The process as set forth in claim 14 in which said intentionally undoped nitrogen-containing silicon layer is formed by means of chemical vapor deposition using a mixture of Ammonia gas, Silane and a carrier gas, a concentration of said Ammonia gas being regulated so that said nitrogen-containing layer has a resistivity of not greater than $10^{12}$ ohm-cm.

17. The process as set forth in claim 14, said nitrogen-containing silicon layer being formed so that said nitrogen-containing silicon layer has a resistivity of not greater than $10^{12}$ ohm-cm.

18. The process as set forth in claim 17, so that said nitrogen-containing silicon layer has a resistivity of approximately $10^{10}$ ohm-cm and a thickness of not less than 20 nanometers.

19. The process as set forth in claim 14, in which said phosphorous is introduced into said intentionally undoped nitrogen-containing silicon layer by using one of a thermal diffusing technique and an ion-implantation.

20. The process as set forth in claim 1, comprising the further steps of depositing an insulating layer over the device; and etching the insulating layer to form side walls around said gate electrode.

21. The process as set forth in claim 8, comprising the further steps of depositing an insulating layer over the device; and etching the insulating layer to from side walls around said gate electrode.

22. The process as set forth in claim 14, comprising the farther steps of depositing an insulating layer over the device; and etching the insulating layer to from side walls around said gate electrode.

23. The process as set forth in claim 1, wherein said patterning forms a two-layer electrode.

24. The process as set forth in claim 1, wherein said patterning forms a two-layer electrode.

25. The process as set forth in claim 14, wherein said patterning forms a two-layer electrode.

* * * * *

UNITED STATES PATENT AND TRADEMARK OFFICE
CERTIFICATE OF CORRECTION

PATENT NO.: 6,048,795
DATED: April 11, 2000
INVENTOR(S): Youichiro NUMASAWA, Shinji FUJIEDA, Yoshinao MIURA It is certified that error(s) appears in the above-identified patent and that said Letters Patent is hereby corrected as shown below:

Column 6, line 29, delete "1" insert --8--.

Column 8, line 29, delete "1" insert --8--.

line 38, delete "farther" insert --further--.

line 41, delete "1" insert --8--.

Signed and Sealed this

Tenth Day of April, 2001

*Attest:*

NICHOLAS P. GODICI

*Attesting Officer*     Acting Director of the United States Patent and Trademark Office